(12) United States Patent
Hayashi (10) Patent No.: US 8,610,143 B2
(45) Date of Patent: Dec. 17, 2013

(54) HIGH OUTPUT POWER LIGHT EMITTING DEVICE AND PACKAGE USED THEREFOR

(75) Inventor: Masaki Hayashi, Anan (JP)

(73) Assignee: Nichia Corporation, Anan-Shi (JP)

( * ) Notice: Subject to any disclaimer, the term of this patent is extended or adjusted under 35 U.S.C. 154(b) by 0 days.

(21) Appl. No.: 12/374,686

(22) PCT Filed: Mar. 7, 2008

(86) PCT No.: PCT/JP2008/054138
§ 371 (c)(1),
(2), (4) Date: May 18, 2009

(87) PCT Pub. No.: WO2008/111504
PCT Pub. Date: Sep. 18, 2008

(65) Prior Publication Data
US 2009/0261374 A1    Oct. 22, 2009

(30) Foreign Application Priority Data
Mar. 12, 2007    (JP) ................. P2007-061599

(51) Int. Cl.
*H01L 29/205* (2006.01)
*H01L 33/00* (2010.01)
(52) U.S. Cl.
USPC ............ 257/91; 257/94; 257/99; 257/103; 257/132; 257/81; 438/107; 438/26
(58) Field of Classification Search
USPC .......... 257/91, 94, 99, 103, 132, 81, 80, 678; 438/107, 26, 119
See application file for complete search history.

(56) References Cited

U.S. PATENT DOCUMENTS 8,093,619 B2 * 1/2012 Hayashi .................... 257/99
2003/0168720 A1 * 9/2003 Kamada .................... 257/666
(Continued)

FOREIGN PATENT DOCUMENTS

JP    6-13657 A    1/1994
JP    11-087780 A    3/1999
(Continued)

OTHER PUBLICATIONS

Japanese Office Action dated Mar. 19, 2013 for Applicaton No. 2008-530258 with partial English translation.

*Primary Examiner* — Telly Green
(74) *Attorney, Agent, or Firm* — Birch, Stewart, Kolasch & Birch, LLP (57) ABSTRACT

An object of the present invention is to provide a light emitting device that has high output power and long service life where a package is suppressed from discoloring due to heat generation. The light emitting device 1 of the present invention contains a light emitting element 10, a package 40 formed of a thermosetting resin, the package having a recess 43 wherein the light emitting element 10 is mounted, a first lead electrode 20 which is exposed at the bottom of the recess 43 of the package 40 and whereon the light emitting element 10 is mounted, and a second lead electrode 30 which is exposed at the bottom of the recess 43 of the package 40 and is electrically connected to the light emitting element 10. The light emitting element 10 is bonded to the first lead electrode 20 through a eutectic layer 70, and at least a surface of the first electrode 20 is coated with an Ag film 22, a thickness of the Ag film 22 being in the range from 0.5 μm to 20 μm.

28 Claims, 5 Drawing Sheets

(56) References Cited

U.S. PATENT DOCUMENTS

| | | | |
|---|---|---|---|
| 2004/0095063 A1* | 5/2004 | Murazaki et al. | 313/503 |
| 2004/0135504 A1* | 7/2004 | Tamaki et al. | 313/512 |
| 2005/0139851 A1* | 6/2005 | Sato | 257/99 |
| 2005/0161771 A1 | 7/2005 | Suchiro et al. | |
| 2005/0280017 A1 | 12/2005 | Oshio et al. | |
| 2006/0012967 A1* | 1/2006 | Asai et al. | 361/764 |
| 2006/0022216 A1 | 2/2006 | Chikugawa | |
| 2006/0118808 A1 | 6/2006 | Ishidu et al. | |
| 2006/0157722 A1 | 7/2006 | Takezawa et al. | |
| 2006/0163999 A1* | 7/2006 | Murazaki et al. | 313/485 |
| 2006/0226774 A1* | 10/2006 | Sofue et al. | 313/512 |
| 2006/0284204 A1* | 12/2006 | Yamazaki et al. | 257/98 |
| 2007/0295482 A1* | 12/2007 | Fitzgerald et al. | 165/80.4 |
| 2008/0023713 A1 | 1/2008 | Maeda et al. | |
| 2008/0067540 A1 | 3/2008 | Ishidu et al. | |
| 2008/0079018 A1 | 4/2008 | Kimura et al. | |
| 2008/0105894 A1 | 5/2008 | Ishidu et al. | |
| 2008/0130290 A1 | 6/2008 | Ohashi et al. | |
| 2009/0050925 A1* | 2/2009 | Kuramoto et al. | 257/100 |
| 2009/0095972 A1* | 4/2009 | Yasuda | 257/99 |
| 2009/0161366 A1 | 6/2009 | Kimura et al. | |
| 2010/0314654 A1* | 12/2010 | Hayashi | 257/99 |

FOREIGN PATENT DOCUMENTS

| | | | | |
|---|---|---|---|---|
| JP | 11-307820 A | 11/1999 | | |
| JP | 2002-270860 A | 9/2002 | | |
| JP | 2005-259972 A | 9/2005 | | |
| JP | 2005-317950 A | 11/2005 | | |
| JP | 2005-353914 A | 12/2005 | | |
| JP | 2006-049442 A | 2/2006 | | |
| JP | 2006-100688 A | 4/2006 | | |
| JP | 2006-156704 | * 5/2006 | | H01L 33/00 |
| JP | 2006-140207 A | 6/2006 | | |
| JP | 2006-156704 A | 6/2006 | | |
| JP | 2006-186297 A | 7/2006 | | |
| JP | 2006-344691 A | 12/2006 | | |
| JP | 2006-344696 A | 12/2006 | | |
| WO | WO 2004/082034 A1 | 9/2004 | | |
| WO | WO-2004/082036 A1 | 9/2004 | | |

* cited by examiner

HIGH OUTPUT POWER LIGHT EMITTING DEVICE AND PACKAGE USED THEREFOR

BACKGROUND OF THE INVENTION

1. Field of the Invention

The present invention relates to a surface-mounted light emitting device used in lighting apparatus, display, backlight light source for cell phone, auxiliary light source for moving picture and other light sources for general use, and resin molding suitable for the same.

2. Description of the Related Art

Surface-mounted light emitting devices based on the light emitting element are small in size, high in power efficiency and are capable of emitting light of clear colors. The light emitting element that is a semiconductor element is also free of failure such as burnout. Moreover, the light emitting element has such advantages as excellent startup characteristic and high durability to vibration and to repetitive operations of turning ON/OFF. Because of such excellent characteristics, the light emitting devices based on light emitting elements such as light emitting diode (LED) and laser diode (LD) are used in various applications of light source.

The conventional surface-mounted light emitting device comprises a light emitting element, a mounting lead frame whereon the light emitting element is mounted, a connection lead frame to be connected via a lead wire to the light emitting element and a package that covers most parts of the lead frames (refer to, for example, Japanese Unexamined Patent Publication (Kokai) No. 11-87780). With regard to the surface-mounted light emitting device, there has been a case where the package is formed by a molding thermoplastic resin (for example, liquid crystal polymer, PPS (polyphenylene sulfide), nylon, etc.) having favorable properties for molding. The thermoplastic resin used to form the package is generally required to have heat resistance so as to endure the high temperature that is caused when melting a reflow solder. Accordingly, engineering polymers such as semi-aromatic polyamide, liquid crystal polymer and PPS, that have relatively high heat resistance among the thermoplastic resins, have been used.

With the recent trend of increasing output power of light emitting devices, heat generated during light emission has been increasing at a remarkable pace. As a result, the package is heated to a high temperature by the heat generated by the light emitting element housed in a recess, and the conventional package formed of a resin has been undergoing discoloration and/or deformation due to the heat.

To counter this problem, such an attempt has been made as the package material is changed to one that has higher heat resistance (refer to, for example, Japanese Unexamined Patent Publication (Kokai) No. 2006-156704), or a heat dissipating structure is provided to prevent the heat generated by the light emitting element from building up in the package (refer to, for example, Japanese Unexamined Patent Publication (Kokai) No. 2006-49442). Heat dissipation from the light emitting element can be improved also by eutectic bonding by means of a soldering material instead of using a die bonding resin when die-bonding the light emitting element to the lead frame (refer to, for example, Japanese Unexamined Patent Publication (Kokai) No. 2006-49442, Japanese Unexamined Patent Publication (Kokai) No. 2005-259972 and Japanese Unexamined Patent Publication (Kokai) No. 2005-353914).

It is also known to extract light efficiently from the light emitting element by applying silver plating to the surface of the lead frame (refer to, for example, Japanese Unexamined Patent Publication (Kokai) No. 2006-156704 and Japanese Unexamined Patent Publication (Kokai) No. 2005-353914). This method is expected also to achieve an effect of suppressing the housing temperature from rising, as the reflectivity of the lead frame is improved by the silver plating resulting in light being suppressed from being absorbed in the light emitting device.

While discoloration and deformation can be significantly suppressed by forming the package from a heat resistant material, it is not enough to counter the effect of the output power of the light emitting element currently available, and the package gradually discolors as the device is used longer. When the package discolors, the amount of light absorbed by the package sharply increases. As the absorbed light turns into heat, temperature of the package rises further, thus feeding a vicious cycle of discoloring the package. As the discoloration of the package proceeds, intensity of light emitted by the light emitting device significantly decreases and makes it necessary to replace the light emitting device. This means that it is important to minimize the discoloration of the package in order to elongate the service life of the light emitting device.

SUMMARY OF THE INVENTION

Accordingly, an object of the present invention is to provide a light emitting device that has high output power and long service life where a package is suppressed from discoloring due to heat generation.

A first light emitting device of the present invention comprises a light emitting element, a package formed of a thermosetting resin, the package having a recess wherein the light emitting element is mounted, a first lead electrode which is exposed at the bottom of the recess of the package and whereon the light emitting element is mounted, and a second lead electrode which is exposed at the bottom of the recess of the package and is electrically connected to the light emitting element. The light emitting element is bonded to the first lead electrode through a eutectic layer, and at least a surface of the first electrode is coated with an Ag film, a thickness of the Ag film being in the range from 0.5 μm to 20 μm.

When the thickness of the Ag film is less than 0.5 μm, crystallinity of the Ag film becomes lower and the Ag film is likely to discolor through sulfurization or oxidation. A discolored portion absorbs light and generates heat and contributes to the temperature rise of the package.

When the thickness of the Ag film is larger than 20 μm, the Ag film becomes more likely to peel off due to thermal stress during bonding of the light emitting element with a soldering material or mounting the light emitting device on a circuit board. That is, when the Ag film is thicker, the Ag film undergoes greater thermal expansion or shrinkage when mounting the light emitting element with a soldering material, thus increasing the possibility of the Ag film peeling off the lead electrode.

According to the present invention, the Ag film that has high crystallinity and high density and is less likely to discolor is obtained by controlling the thickness of the Ag film to 0.5 μm or larger. As a result, the Ag film is suppressed from absorbing light, and heat generated in the package is decreased. On the other hand, the Ag film is suppressed from peeling off by controlling the thickness of the Ag film to 20 μm or less, while maintaining a sufficient contact area between the Ag film and the eutectic layer. As a result, heat generated by the light emitting element is transferred efficiently through the eutectic layer to the lead electrode, thus improving the heat dissipation of the light emitting device. There is also such an effect achieved as the strength of bonding between the light emitting element and the lead electrode is increased so that failure rate of the light emitting element can be reduced.

A second light emitting device of the present invention comprises a light emitting element, a package formed of a thermosetting resin, the package having a recess wherein the light emitting element is mounted, a first lead electrode which is exposed at the bottom of the recess of the package and whereon the light emitting element is mounted, and a second lead electrode which is exposed at the bottom of the recess of the package and is electrically connected to the light emitting element. The light emitting element is bonded to the first lead electrode through a eutectic layer, at least a surface of the first electrode is coated with an Ag film, and a part of the surface of the first or second lead electrode is a bonding region to be bonded with the light emitting element, the bonding region having a flatness in the range from 0.001 to 50 μm.

In the present invention, the term "flatness" refers to the height of the center of a measuring region from a datum plane that is determined by measuring the height of three corners of the measuring region.

The eutectic layer has lower strength of bonding with the Ag film, lower wettability to the Ag film and lower fluidity than the die bonding resin. As a result, when flatness of a portion of the lead electrode where the light emitting element is bonded becomes larger (the surface becomes rougher) due to complication of such factors as the flatness of the lead before being plated, the conditions of forming the Ag film and the conditions of molding process, the eutectic material is not capable of flowing between the eutectic layer and the Ag film, thus making it impossible to achieve a sufficient bonding between the eutectic layer and the Ag film. When the flatness is larger than 50 μm, in particular, the bonding area decreases considerably that leads to a decrease in heat dissipation of the light emitting device and a decrease in the bonding strength between the light emitting element and the lead frame.

When the flatness of the Ag film is less than 0.001 μm, on the other hand, the Ag film that is too smooth does not provide tiny surface irregularities whereon the eutectic layer is to be anchored. As a result, peel-off becomes more likely to occur between the eutectic layer and the Ag film, thus leading to a decrease in the bonding strength.

According to the present invention, flatness of the Ag film (namely the flatness of the surface of the lead electrode that is covered by the Ag film) is controlled in a range from 0.001 to 50 μm, thereby improving the efficiency of dissipating heat generated by the light emitting element, and increasing the bonding strength between the light emitting element and the lead frame, thus achieving an effect of reducing the failure rate of the light emitting device.

According to the present invention, as described above, heat buildup in the light emitting device can be mitigated and the package can be suppressed from discoloring, so that the light emitting device of high output power and long service life can be made. Moreover, according to the present invention, bonding strength between the light emitting element and the lead frame can be increased and therefore failure rate of the light emitting device can be reduced.

DETAILED DESCRIPTION OF THE INVENTION

The light emitting device of the present invention will now be described by way of embodiments and Examples. It should be noted, however, that the present invention is not limited to the embodiments and Examples.
First Embodiment
The light emitting device 1 of this embodiment shown in FIG. 1 and FIG. 2 comprises a light emitting element 10, a package 40 having a recess 43 to mount the light emitting element 10 thereon, and a sealing member 50 that covers the light emitting element 10.

Figure 1:
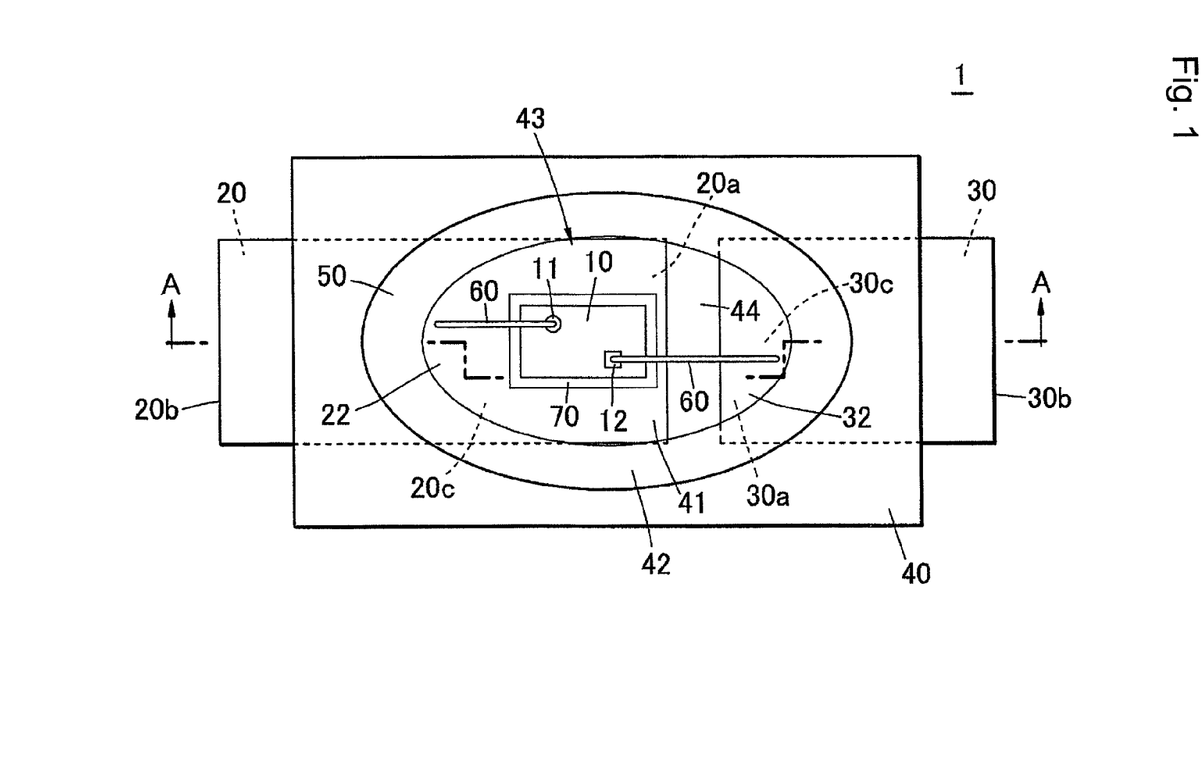
FIG. 1 is a schematic top view showing a light emitting device according to first embodiment.
Figure 2:
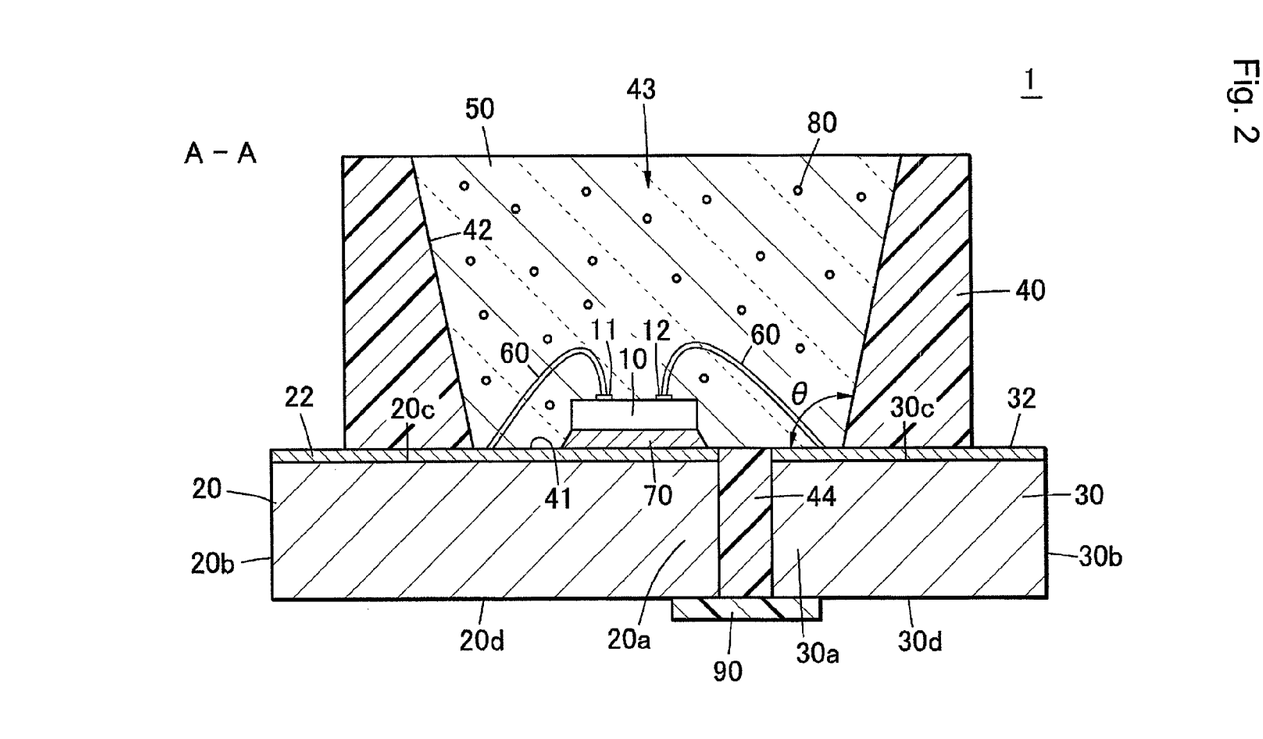
FIG. 2 is a schematic sectional view of the light emitting device taken along lines A-A of FIG. 1.

The package 40 has two lead electrodes (a first lead electrode 20 and a second lead electrode 30) fixed thereon, and surfaces of ends of the lead electrodes 20, 30 on one side thereof (inner lead sections 20a, 30a) are exposed at the bottom 41 of the recess 43.

Ends of the lead electrodes 20, 30 on the other side thereof (outer lead sections 20b, 30b) protrude to the outside of the package 40.

The light emitting element 10 is mounted in the recess 43 of the package 40 through a eutectic layer 70 on an upper surface 20c of the inner lead 20a of the first lad electrode 20. The light emitting element 10 shown is such a type as two electrodes 11, 12 are formed on the surface thereof, where the first electrode 11 is electrically connected via a wire 60 to the upper surface 20c of the inner lead 20a of the first lead electrode 20, and the second electrode 11 of the light emitting device 1 is electrically connected via the wire 60 to the upper surface 30c of the inner lead 30a of the second lead electrode 30.

According to the present invention, the light emitting element 10 having such a constitution that has a pair of positive and negative electrode on the upper surface and bottom surface thereof may also be used.

In the light emitting device 1 of the present invention, the surface of the inner lead 20a of the first lad electrode 20 whereon the light emitting element 10 is mounted is covered by an Ag film 22. It is preferable that the upper surface 30c of the second lead electrode 30 is also covered by an Ag film 32. The Ag films 22, 32 have the function of reflecting emitted light before it reaches the lead electrodes 20, 30. The lead electrodes 20, 30 in common use are formed of materials having high electrical conductivity such as copper, although such materials having high electrical conductivity are not particularly high in light reflectivity. As a result, when light emitted by the light emitting element 10 reaches the lead electrodes 20, 30, part of light is absorbed and transformed into heat, thus making a cause of rising temperature in the light emitting device 1. Absorption of light by the lead electrodes 20, 30 also means a loss of light in the light emitting device 1, and therefore causes a decrease in the intensity of light emitted by the light emitting device 1. Therefore, the intensity of light emitted by the light emitting device 1 can be increased by covering the lead electrodes 20, 30 with the Ag film having high light reflectivity thereby suppressing temperature in the light emitting device 1 from rising.

In the first light emitting device of this application, the thickness of the Ag film 22 formed on the surface of the first lead electrode 20 is set in a range from 0.5 to 20 μm, thereby achieving effects described below.

According to the present invention, the Ag film that is high in crystallinity, high in density and is less likely to discolor can be obtained by controlling the thickness of the Ag film to 0.5 μm or larger. As a result, the Ag film is suppressed from absorbing light, and heat generated in the package is decreased. On the other hand, the Ag film is suppressed from peeling off and a sufficient contact area is ensured between the Ag film and the eutectic layer by controlling the thickness of the Ag film to 20 μm or less. As a result, heat generated by the light emitting element is transferred efficiently through the eutectic layer to the lead electrode, thus improving the heat dissipation of the light emitting device. There is also such an effect being achieved as the strength of bonding between the light emitting element and the lead electrode is increased so that failure rate of the light emitting element can be reduced.

In the second light emitting device of this application, flatness of the first lead electrode 20 is set in a range from 0.001 to 50 μm, thereby making it possible to efficiently dissipating the heat generated by the light emitting element and suppressing the package 40 from discoloring to yellow. Operation and effect of the second light emitting device will be described below.

The eutectic layer 70 that fixes the light emitting element 10 onto the first lead electrode 20 can be formed of a metallic soldering material. Since the eutectic layer 70 formed of a metal has high heat conductivity, heat generated by the light emitting element 10 when the light emitting device 1 is turned on is efficiently transmitted via the eutectic layer 70 to the first lead electrode 20. Then the heat can be dissipated through the outer lead 20b of the first lead electrode 20 to the outside. Thus the eutectic layer 70 suppresses the temperature of the light emitting device from rising.

For the heat dissipation from the light emitting element 10 via the eutectic layer 70 to the first lead electrode 20, an important role is played by the efficiency of heat transfer through the interface between different materials, as well as the heat conductivity of each material. The interface between the eutectic layer 70 and the first lead electrode 20, where bubbles tend to be formed, is thought to be particularly susceptible to decrease in the efficiency of heat transfer. Therefore, in the second light emitting device of the present invention, emphasis is placed on suppressing the bubbles from being generated in the interface between the eutectic layer 70 and the first lead electrode 20, so as to efficiently dissipate heat generated in the light emitting device 1 to the outside.

Generation of bubbles in the interface between the eutectic layer 70 and the first lead electrode 20 is supposed to be influenced by the surface roughness of the first lead electrode 20 and the low wettability of the molten eutectic layer 70.

To mount the light emitting element 10 by means of the eutectic layer 70, first the eutectic layer 70 is formed by a physical or chemical process on the back surface of the light emitting element 10, then the light emitting element 10 is placed on the upper surface of the first lead electrode 20. In this process, the light emitting element 10 is disposed such that the eutectic layer 70 makes contact with the first lead electrode 20. Then the eutectic layer 70 is reflowed so that the molten eutectic layer 70 covers the surface of the first lead electrode 20, and then cooled down thereby fixing the light emitting element 10 onto the first lead electrode 20. The eutectic layer 70 has lower wettability to the Ag film formed on the lead electrode 20 and is used in the form of a film thinner than the die bonding resin that has been used in mounting the light emitting element in the prior art. As a result, few irregularities on the surface of the lead electrode would allow bubbles to remain in the interface. Therefore, it is preferable to reduce the irregularities on the surface of the first lead electrode so as to suppress the bubbles from forming.

According to the present invention, contact area is effectively suppressed from decreasing by making the first lead electrode 20 with smooth surface having flatness of 50 μm or less. This makes it possible to efficiently dissipate the heat generated by the light emitting element 10 and suppressing the package 40 from discoloring to yellow.

When the surfaces of the first lead electrode 20 and the second lead electrode 30 are too flat, however, bonding with the package 40 becomes weak. Accordingly in the present invention, flatness of the first lead electrode 20 and the second lead electrode 30 is controlled to from 0.001 μm or more, so as to prevent the first lead electrode 20 from peeling off the package 40. As a result, the lead electrodes 20, 30 are made less likely to peel off even in the light emitting device 1 where the lead electrodes 20, 30 are exposed on the back surface.

Surface irregularities of the first lead electrode 20 may be decreased either by polishing the surfaces of the lead electrodes 20, 30, or by increasing the thickness of the Ag film 22. However, since the Ag film 22 is a soft material, peel off and/or cracks tend to occur when the Ag film 22 is too thick. Therefore, the thickness of the Ag film is preferably in a range from 0.5 to 20 μm. When the Ag film 22 is 0.5 μm or more in thickness, the effect of smoothing out the surface irregularities of the first lead electrode 20 is obtained. When the Ag film is 20 μm or less in thickness, peel-off is less likely to occur in the film. The thickness of the Ag film 22 is more preferably in a range from 1 to 15 μm.

The outer lead sections 20b, 30b of the lead electrodes 20, 30 may be broadly regarded as the portions of the lead electrodes connected to the external electrodes. Accordingly, all the exposed portions of the lead electrode may be called the outer lead. Hence in the light emitting device 1 of this embodiment, lower surfaces 20d, 30d of the lead electrodes 20, 30 may serve as the outer leads 20b, 30b, respectively. The first outer lead 20b has the function of dissipating the heat from the light emitting device 1 as well as the electrical connection to the external electrode.

The package 40 is preferably formed of a thermosetting resin that has high heat resistance. Thermosetting resins suitable for use in the present invention are those having tolerable temperatures of 100° C. or higher after curing, such as at least one kind selected from among the group consisting of a triazine-induced epoxy resin, an epoxy resin, a modified epoxy resin, a silicone resin, a modified silicone resin, an acrylate resin and an urethane resin. An epoxy resin containing a triazine-induced epoxy resin is particularly preferably used.

In case a transparent thermosetting resin is used, it is preferable to mix a light reflecting material therein so as to efficiently reflect the light emitted by the light emitting element.

In this embodiment, capability to control the directivity of light emission from the light emitting element 10 and efficiency of extracting light are improved by flaring the recess 43 of the package 40 toward the opening. As a result, a side face 42 of the recess 43 is inclined. When inclination of the side face of the recess 43 is defined by an inclination angle θ (refer to FIG. 2) which is measured from the bottom surface 41 to the side face 42 through inside of the recess 43, the inclination angle θ is preferably in a range from 95 to 150°, more preferably from 100 to 120°. By controlling the angle within such a range, it is made possible to make the light emitting device 1 having directivity that makes it easier to use a variety of light sources. The side face 42 may not necessarily be inclined, and such a configuration may also be preferably used as the side face 42 is perpendicular to the bottom surface.

While the side face 42 of the recess 43 may be smoothed, bonding between the package 40 and the sealing member 50 may be improved by making the surface rough.

The principal surface of the package 40 has a rectangular shape, although it may have oval, circular, pentagon, hexagonal or other shape. The principal surface of the recess 43 has an oval shape, although it may have substantially circular, rectangular, pentagon, hexagonal or other shape. The package 40 may have a cathode mark indicating the direction of positive electrode of the light emitting element 10.

The first lead electrode 20 and the second lead electrode 30 are separated by a part of the package 40, so as to prevent the electrodes from short-circuiting.

In this embodiment, the light emitting device 1 can be used in surface mount, in which case stability of mounting can be improved by disposing the lead electrodes 20, 30 such that the back surfaces thereof (outer leads 20b, 30b) lie in substantially the same plane. In case the light emitting device 1 is soldered, on the back surfaces of the lead electrodes 20, 30, onto a circuit board, the solder may spread between the first lead electrode 20 and the second lead electrode 30, resulting in short-circuiting. To prevent this, a thin electrically insulating film 90 may be formed on the back surface of a part of the package 40 located between the first lead electrode 20 and the second lead electrode 30 (this portion will be referred to as separating portion 44).

The eutectic layer 70 is preferably formed of a soldering material having a melting point in a range from 200° C. to 350° C. When the melting point of the eutectic layer 70 is lower than 200° C., the eutectic layer 70 may be oxidized or sulfurized on the surface thereof leading to discoloration during use with the light emitting device 1 turned on. Discoloration of the eutectic layer 70 is not desirable since it increases the absorption of light that is emitted by the light emitting element and induces a temperature increase in the light emitting device 1 and a decrease in the intensity of light emitted by light emitting device 1. When the melting point of the eutectic layer 70 is higher than 350° C., it may be higher than the tolerable temperature of the thermosetting resin used to form the package 40. As a result, the package 40 may be discolored to yellow due to the heat generated when reflowing the eutectic layer 70 for mounting the light emitting element 10 as described later. Therefore the eutectic layer 70 having the melting point higher than 350° C. is not desirable.

According to the present invention, greater effects of suppressing the temperature of the light emitting device 1 from rising and improving the intensity of light emission can be achieved when the light emitting element emits light of a wavelength that is more likely to be absorbed by the lead electrodes 20, 30 and more likely to be reflected by the Ag films 22, 32. Accordingly, emission wavelength in the present invention is preferably in a range from 400 nm to 530 nm. It is preferable that the package 40 has reflectivity of 70% or higher in this wavelength region. When reflectivity of the package 40 is lower than 70%, the package 40 absorbs light emitted by the light emitting element and induces temperature increase in the light emitting device 1 thereby decreasing the intensity of light emitted by light emitting device 1. Therefore the package 40 having the reflectivity lower than 70% is not desirable.

In this embodiment, the recess 43 of the package 40 is filled with a sealing member 50 so as to cover the light emitting element 10. The sealing member 50 is provided to protect the light emitting element 10 from extraneous forces, dust and moisture. Emitted light can be efficiently extracted to the outside of the light emitting element 10, by controlling the difference in refractive index between the light emitting element 10 and the sealing member 50. The sealing member 50 is disposed in the recess 43 of the package 40.

The sealing member 50 is preferably formed of a thermosetting resin that has high heat resistance, which enables it to suppress the resin from being discolored to yellow by heat, as in the case of the package 40. When the sealing member 50 has properties which are the same as or similar to those of the thermosetting resin used to form the package 40, bonding between the sealing member 50 and the package 40 and the resistance against peel-off during thermal expansion can be improved.

The sealing member 50 may contain a fluorescent material 80 mixed therein. The fluorescent material 80 is used when it is desired to produce light of a color different from that of light emitted by the light emitting element 10, in the light emitting device 1. When the light emitting element 10 that emits blue light and the fluorescent material 80 that absorbs the blue light and emits yellow light are combined, for example, the light emitting device 1 that emits white light based on the relationship of complementary colors can be provided.

The fluorescent material 80 may be dispersed uniformly in the sealing member 50 as schematically shown in FIG. 2. However, fluorescent material 80 in common use has specific gravity larger than that of the sealing member 50, and is therefore sealed in the sealing member 50 in the state of having precipitated near the bottom 41 of the recess 43 of the package 40.

The constituent members will now be described in detail.

Light Emitting Element 10

The light emitting element 10 comprises a light emitting layer formed of a semiconductor material such as GaAlN, ZnS, ZnSe, SiC, GaP, GaAlAs, AlN, InN, AlInGaP, InGaN, GaN or AlInGaN formed on a substrate. The semiconductor may have homojunction structure, heterojunction structure or double heterojunction structure with such a structure as MIS junction, PIN junction or PN junction. An emission wavelength can be selected from a wide range from ultraviolet to infrared rays, depending on the kind of semiconductor material and the proportion of the mixed crystal. The light emission layer may be formed in a thin film that exhibits quantum effect, with single quantum well structure or multiple quantum well structure.

For an application to outdoor use, it is preferable to use nitride gallium compound semiconductor that is capable of forming a light emitting element of high luminance. To emit red light, a semiconductor material based on gallium-aluminum-arsenic or aluminum-indium-gallium-phosphorus is preferably used, while a variety of semiconductor materials may be used in accordance to the application.

When nitride gallium compound semiconductor is used, sapphire, spinel, SiC, Si, ZnO, GaN single crystal or the like is used as the semiconductor substrate. It is preferable to use sapphire substrate in order to form nitride gallium of good crystallinity satisfactorily in volume production. An example of the light emitting element 10 that employs nitride compound semiconductor will be described. A buffer layer is formed of GaN, AlN or the like on a sapphire substrate. Then a first contact layer of N type or P type GaN, an active layer that is an InGaN thin film having quantum effect, a cladding layer of N type or P type AlGaN and a second contact layer of N type or P type GaN are formed successively on the buffer layer. Nitride gallium compound semiconductor shows N-type conductivity when not doped with impurity. In order to form a desired N-type nitride gallium compound semiconductor of improved efficiency of light emission, Si, Ge, Se, Te, C or the like is added as an N-type dopant.

In order to form a desired P-type nitride gallium compound semiconductor, Zn, Mg, Be, Ca, Sr, Ba or the like is added as a P-type dopant. Nitride gallium semiconductor cannot be readily turned to P type simply by doping with a P-type dopant. Therefore it is necessary to anneal by heating in a furnace or irradiating with a low-energy electron beam or plasma beam after introducing the P-type dopant, thereby to turn the semiconductor into P type. A semiconductor wafer prepared in this way is subjected to partial etching or the like, so as to form positive and negative electrodes. The semiconductor wafer is then cut into predetermined size to make the light emitting elements.

The light emitting element 10 can be used in plurality as required, and color blending in the emission of white light can be improved through proper combination thereof. For example, two light emitting elements 10 that emit green light, one light emitting element 10 that emits blue light and one light emitting element 10 that emits red light may be combined. To make a full-color light emitting device for display, emission wavelengths are preferably from 610 nm to 700 nm for red light, from 495 nm to 565 nm for green light, and from 430 nm to 490 nm for blue light. In order to emit white light by color blending with the surface-mounted light emitting device of the present invention, the emission wavelength of the light emitting element is preferably in a range from 430 nm to 530 nm, more preferably from 430 nm to 490 nm, in consideration of the complementary color relationship with the emission wavelength of the fluorescent material and deterioration of a transparent resin. To improve the efficiencies of light emission and excitation of the light emitting element and the fluorescent material, the emission wavelength is furthermore preferably in a range from 450 nm to 475 nm. A light emitting element that emits light mainly in the ultraviolet region or in the shorter part of the visible region of the wavelength shorter than 400 nm may also be used, by combining with a member that is less susceptible to deterioration when exposed to ultraviolet rays.

The light emitting element 10 has a size of □600 μm, although other sizes such as □1 mm, □450 μm, □320 μm, etc. may also be mounted.

Package 40

The material of a package 40 is a cured material of a thermosetting resin. The package is preferably formed of at least one kind selected from the group consisting of an epoxy resin, a modified epoxy resin, a silicone resin, a modified silicone resin, an acrylate resin and an urethane resin among thermosetting resins, and particularly preferably an epoxy resin, a modified epoxy resin, a silicone resin or a modified silicone resin. For example, there can be used a B-staged solid epoxy resin composition obtained by adding 0.5 parts by weight of DBU (1,8-diazabicyclo(5,4,0)undecene-7) (Chemical Formula 6) as a curing accelerator, 1 part by weight of ethylene glycol (Chemical Formula 7) as a promoter, 10 parts by weight of a titanium oxide pigment and 50 parts by weight of a glass fiber to 100 parts by weight of a colorless and transparent mixture, that is obtained by mixing epoxy resins of triglycidyl isocyanurate (Chemical Formula 1) and hydrogenated bisphenol A diglycidyl ether (Chemical Formula 2), acid anhydrides of hexahydrophthalic anhydride (Chemical Formula 3), 3-methylhexahydrophthalic anhydride (Chemical Formula 4) and 4-methylhexahydrophthalic anhydride (Chemical Formula 5) with dissolving in an equivalent ratio, followed by partial curing with heating.

[Chemical Formula 1]

[Chemical Formula 2]

[Chemical Formula 3]

[Chemical Formula 4]

[Chemical Formula 5]

[Chemical Formula 6]

[Chemical Formula 7]

HO—CH$_2$—CH$_2$—OH

The package 40 is preferably formed of a hard material in order to render functions required as a package. Although the package 40 may have a transparent property or not, it is possible to appropriately design according to the purposes. For example, light to be transmitted through the package 40 can be decreased when the package 40 contains a light shading material. The package can also contain a filler or a diffusing agent so that light from a surface-mounted light emitting device is uniformly emitted mainly to the front and side. A white pigment may be added in place of a dark-colored pigment in order to decrease absorption of light. As described above, the package 40 can also contain at least one kind selected from a filler, a diffuser, a pigment, a fluorescent material, a reflecting material and light shading material in order to render desired functions.

First Lead Electrode 20 and Second Lead Electrode 30

The first lead electrode 20 and the second lead electrode 30 can be formed of a good electrical conductor such as iron, phosphor bronze, copper alloy or the like. In order to improve the reflectivity of the electrodes to the light from the light emitting element 10, the first lead electrode 20 and the second lead electrode 30 may be plated with a metal such as silver, aluminum, copper or gold. It is preferable that the first lead electrode 20 and the second lead electrode 30 are smoothed on the surfaces thereof to improve the reflectivity. The first lead electrode 20 and the second lead electrode 300 may also be increased in the surface area so as to improve the heat dissipation. This makes it possible to effectively suppress the temperature of the light emitting element 10 from rising and flow a relatively larger electrical current through the light emitting element 10. Heat dissipation may also be improved by forming the first lead electrode 20 and the second lead electrode 30 with a larger thickness. In this case, the first lead electrode 20 and the second lead electrode 30 are difficult to process such as bending, and are therefore cut into predetermined sizes. Forming the first lead electrode 20 and the second lead electrode 30 with a larger thickness also decreases the deflection of the first lead electrode 20 and the second lead electrode 30, thereby making it to mount the light emitting element 10. When the first lead electrode 20 and the second lead electrode 30 are formed with a smaller thickness, on the contrary, it becomes easier to process such as bending, and therefore can be formed in a desired shape.

The first lead electrode 20 and the second lead electrode 30 are a pair of positive and negative electrodes. The first lead electrode 20 and the second lead electrode 30 may be provided at least one each, but may also be provided in plurality. In case a plurality of the light emitting elements 10 are placed on the first lead electrode 20, it is necessary to provide a plurality of the second lead electrodes 30.

Sealing Member 50

The sealing member 50 is formed of a thermosetting resin. Among thermosetting resins, it is preferable to use at least one kind selected from the group consisting of an epoxy resin, a modified epoxy resin, a silicone resin, a modified silicone resin, an acrylate resin and a urethane resin, and particularly an epoxy resin, a modified epoxy resin, a silicone resin and a modified silicone resin. The sealing member 50 is preferably formed of a hard material in order to protect a light emitting element 10. The sealing member 50 is preferably formed of a resin having high heat resistance, high weatherability and high light fastness. The sealing member 50 may also contain at least one kind selected from the group consisting of a filler, a dispersant, a pigment, a fluorescent material and a reflecting material, in order to render desired functions. The sealing member 50 may also contain a dispersant. For the dispersant, barium titanate, titanium oxide, aluminum oxide, silicon oxide, etc. may be preferably used. The sealing member 50 may also contain a dye or a pigment of an organic or inorganic material for the purpose of cutting off light of undesirable wavelengths. The sealing member 50 may also contain a fluorescent material 80 that absorbs light from the light emitting element 10 and emits light of a different wavelength.

Fluorescent Material 80

There is no restriction on the fluorescent material 80 as long as it can absorb the light emitted by the light emitting element 10 and emit light of a different wavelength. For example, it is preferable to use at least one selected from among a nitride-based fluorescent material, an oxide-nitride-based fluorescent material or sialon-based fluorescent material activated mainly with a lanthanoid element such as Eu or Ce, an alkaline earth element halogen apatite fluorescent material activated mainly with a lanthanoid element such as Eu or with a transition metal element such as Mn, an alkaline earth metal element boride halogen fluorescent material, an alkaline earth metal element aluminate fluorescent material, an alkaline earth element silicate fluorescent material, an alkaline earth element sulfide fluorescent material, an alkaline earth element thiogalate fluorescent material, an alkaline earth element silicon nitride fluorescent material or a germanate fluorescent material, rare earth aluminate or rare earth silicate activated mainly with a lanthanoid element such as Ce, and an organic or inorganic complex activated mainly with a lanthanoid element such as Eu. Specifically, fluorescent materials listed below may be used, although possible materials are not limited to these.

Examples of the nitride-based fluorescent material activated mainly with a lanthanoid element such as Eu or Ce include $M_2Si_5N_8$:Eu and $CaAlSiN_3$:Eu (M is at least one kind selected from Sr, Ca, Ba, Mg and Zn). It also includes, in addition to $M_2Si_5N_8$:Eu, $MSi_7N_{10}$:Eu, $M_{1.8}Si_5O_{0.2}N_8$:Eu and $Mo_{0.9}Si_7O_{0.1}N_{1.0}$:Eu (M is at least one kind selected from Sr, Ca, Ba, Mg and Zn).

Examples of the acid nitride-based fluorescent material activated mainly with a lanthanoid element such as Eu or Ce include $MSi_2O_2N_2$:Eu (M is at least one kind selected from Sr, Ca, Ba, Mg and Zn).

Examples of the sialon fluorescent material activated mainly with a lanthanoid element such as Eu or Ce include $M_{p/2}Si_{1\,2-p-q}Al_{p+q}O_qN_{1\,6-p}$:Ce and M-Al—Si—C—N (M is at least one kind selected from Sr, Ca, Ba, Mg and Zn, q is from 0 to 2.5, and p is 1.5 from 3).

Examples of the alkaline earth element halogen apatite fluorescent material activated mainly with a lanthanoid element such as Eu or a transition metal element such as Mn include $M_5(PO_4)_3X$:R (M is at least one kind selected from Sr, Ca, Ba, Mg and Zn, X is at least one kind selected from F, Cl, Br and I, and R is at least one kind of Eu, Mn, Eu and Mn).

Examples of the alkaline earth metal element boride halogen fluorescent material include $M_2B_5O_9X$:R (M is at least one kind selected from Sr, Ca, Ba, Mg and Zn, X is at least one kind selected from F, Cl, Br and I, and R is at least one of Eu, Mn, and Eu and Mn).

Examples of the alkaline earth metal element aluminate fluorescent material include $SrAl_2O_4$:R, $Sr_4Al_{14}O_{25}$:R, $CaAl_2O_4$:R, $BaMg_2Al_{16}O_{27}$:R, $BaMg_2Al_{16}O_{12}$:R, and $BaMgAl_{10}O_{17}$:R (R is at least one of Eu, Mn, and Eu and Mn).

Examples of the alkaline earth element sulfide fluorescent material include $La_2O_2S$:Eu, $Y_2O_2S$:Eu and $Gd_2O_2S$:Eu.

Examples of the rare earth aluminate fluorescent material activated mainly with a lanthanoid element such as Ce include YAG-based fluorescent materials represented by the composition formulas such as $Y_3Al_5O_{12}$:Ce, $(Y_{0.8}Gd_{0.2})_3Al_5O_{12}$:Ce, $Y_3(Al_{0.8}Ga_{0.2})_5O_{12}$:Ce and $(Y,Gd)_3(Al,Ga)_5O_{12}$. It also includes $Tb_3Al_5O_{12}$:Ce, $Lu_3Al_5O_{12}$:Ce in which a portion or all of Y is/are substituted with Tb or Lu.

Examples of the other fluorescent material include ZnS: Eu, $Zn_2GeO_4$:Mn, $MGa_2S_4$:Eu (M is at least one kind selected from Sr, Ca, Ba, Mg and Zn, and X is at least one kind selected from F, Cl, Br and I).

The above fluorescent materials can optionally contain at least one kind selected from Tb, Cu, Ag, Au, Cr, Nd, Dy, Co, Ni and Ti, in addition to, or in place of Eu.

It is also possible to use fluorescent materials other than the above fluorescent material, which have the same performances and effects.

As well as the fluorescent material that are excited by the light from the light emitting element 10 and emit yellow, red, green or blue light, the fluorescent material that emits light of intermediate colors such as yellow, bluish green or orange may be used. By combining these fluorescent materials, it is made possible to manufacture surface-mounted light emitting devices that emit light of various colors.

For example, a GaN compound semiconductor that emits blue light may be used to excite a fluorescent material having the composition of $Y_3Al_5O_{12}$:Ce or $(Y_{0.8}Gd_{0.2})_3Al_5O_{12}$:Ce to as to convert the light into that of a different wavelength. The surface-mounted light emitting device that emits white light can be made by blending the light from the light emitting element 10 and the light from the fluorescent material 80.

For example, the fluorescent material 80 consisting of $CaSi_2O_2N_2$:Eu or $SrSi_2O_2N_2$:Eu that emits in a range from green to yellow and $(Sr,Ca)_5(PO_4)_3Cl$:Eu that emits blue light, $(Ca,Sr)_2Si_5N_8$:Eu that emits red light may be used to provide the surface-mounted light emitting device that emits white light with good color rendering performance. This constitution uses the three primary colors, red, blue and green, white light of desired tone can be produced simply by changing the proportions of the first fluorescent material and the second fluorescent material.

Others

The surface-mounted light emitting device may also be provided with a zener diode as a protective element. The zener diode may be mounted on the first lead electrode 20 at the bottom 41 of the recess 43, away from the light emitting element 10. The zener diode may also be mounted on the first lead electrode 20 at the bottom 41 of the recess 43, with the light emitting element 10 mounted thereon. Sizes such as □300 μm may be employed as well as □280 μm.

The wires 60 are used in electrical connection between the second electrode 12 of the light emitting element 10 and the second lead electrode 30 and between the first electrode 11 of the light emitting element 10 and the first lead electrode 20. The wires 60 are required to have good ohmic contact with the electrodes of the light emitting element 10, good mechanical connectivity, high electrical conductivity and high heat conductivity. Heat conductivity is preferably 0.01 cal/(S) (cm$^2$)(° C./cm) or higher, and more preferably 0.5 cal/(S) (cm$^2$)(° C./cm) or higher. The wire is disposed to run from right above the light emitting element 10 to a wire bonding area of plated wiring pattern, so as to provide electrical continuity.

Method for Manufacturing Surface-Mounted Light Emitting Device

The method for manufacturing the light emitting devices of the present invention will now be described with reference to FIG. 3A to FIG. 3E.

1. Formation of Lead Electrodes 20, 30

First, the first lead electrode 20 and the second lead electrode 30 are coated with Ag film on the surface thereof. While the Ag film may be formed by electrical Ag plating method, electroless Ag plating, PVD method, CVD method or the like, electrical Ag plating method is preferably employed in consideration of the trade-off of cost and quality. The electrical Ag plating method in this specification means electrodeposition process in which the lead electrode is used as a negative electrode in an electrolyte solution containing metal ions to flow electrical current, so as to deposit Ag (or a metal to form the base as required) on the surface of the lead electrode. The electrical Ag plating method will now be described in detail.

First, lead electrodes 20, 30 are immersed in dip-degreasing alkaline solution, electrolysis-degreasing alkaline solution, so as to remove oil and fat. Then the lead electrodes 20, 30 are immersed in an acidic solution to remove oxide film. The electrodes are also immersed in a neutralizing solution to neutralize the alkalinity. Then base preparation is carried out prior to the Ag plating, by electrical Cu strike plating, electrical Cu plating, electrical Ag strike plating, etc. The lead electrodes 20, are immersed successively in electrolyte solutions appropriate for the base treatment, so as to deposit the base metal on the surface. Upon completion of the base treatment, the lead electrodes 20, 30 are immersed in the electrolyte solution for Ag plating so as to deposit Ag. After the electrodeposition in the electrolyte solutions, the lead electrodes 20, 30 are washed in pure water. After the last cleaning with pure water following the Ag plating, the lead electrodes 20, 30 are dried.

Through the series of processes described above, the lead electrodes 20, 30 are coated with Ag films 22, 32 on the surface thereof.

2. Sandwiching of Lead Electrodes 20, 30 Between Dies 120, 121

Figure 3A:
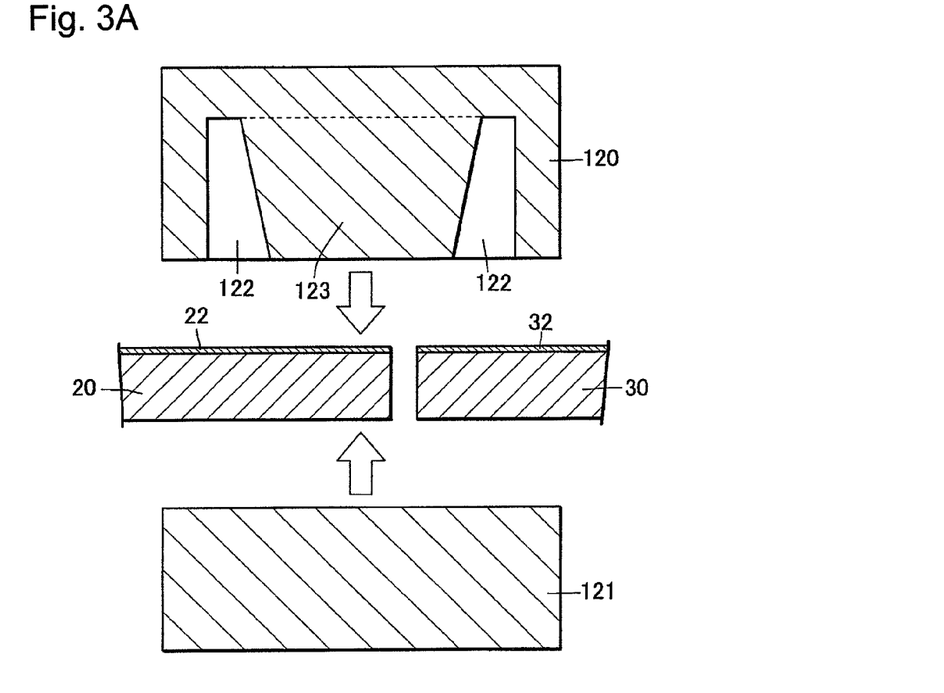
FIG. 3A is a schematic sectional view of a process of manufacturing the surface-mounted light emitting device according to the first embodiment.
Figure 3B:
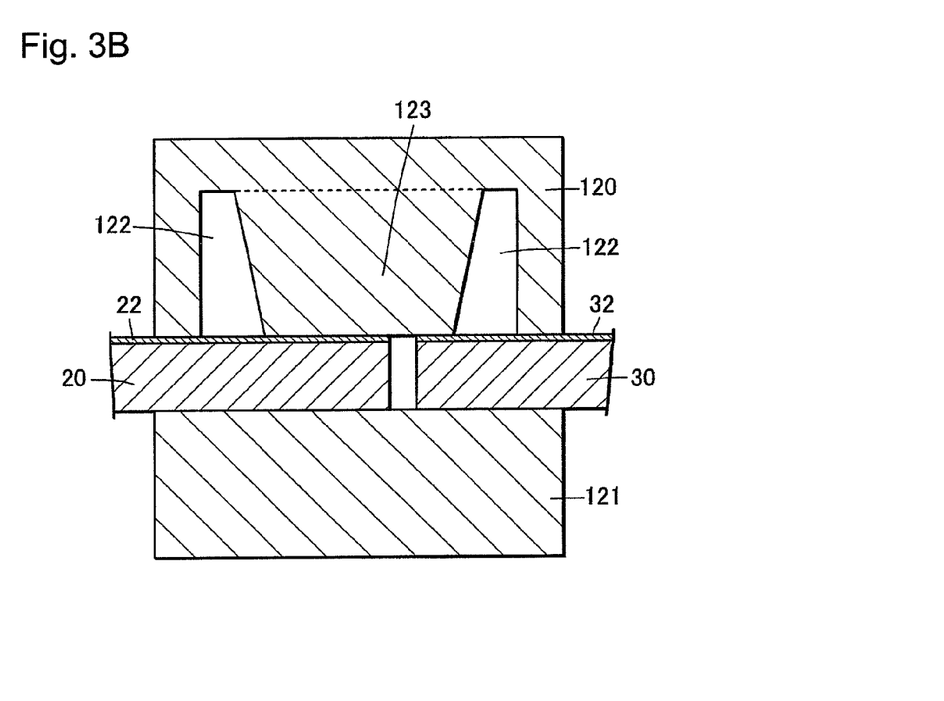
FIG. 3B is a schematic sectional view of a process of manufacturing the surface-mounted light emitting device according to the first embodiment.

As shown in FIG. 3A and FIG. 3B, the first lead electrode 20 and the second lead electrode 30 are sandwiched between upper die 120 and lower die 121 from above and below, with the side coated with the Ag film facing upward. The upper die 120 has an inner cavity 122 that corresponds to the shape of the package 40 and a protrusion 123 that forms the recess of the package. The thermosetting resin used to form the package 40 has high fluidity and may infiltrate into the gap between the first lead electrode 20, the second lead electrode 30 and the protrusion 123. When the thermosetting resin deposits on the upper surface of the first lead electrode 20 and the second lead electrode 30, the lead electrodes 20, 30 are covered by an insulating film, which should be avoided. Therefore it is preferable to press the lead electrodes 20, upward with the lower die 121 so as to press the first lead electrode 20 and the second lead electrode 30 against the protrusion 123.

While the lower die has a flat shape in this example, the lower die may have an inner cavity depending on the type of the package 40. In this case, it becomes difficult to press the lead electrodes 20, 30 upward with the lower die 121. This problem may be countered by providing a ridge for forcing upward in a part of the lower die, or providing a separate member that penetrates the lower die for pressing the lead electrodes 20, 30 upward.

3. Molding of Package

Figure 3C:
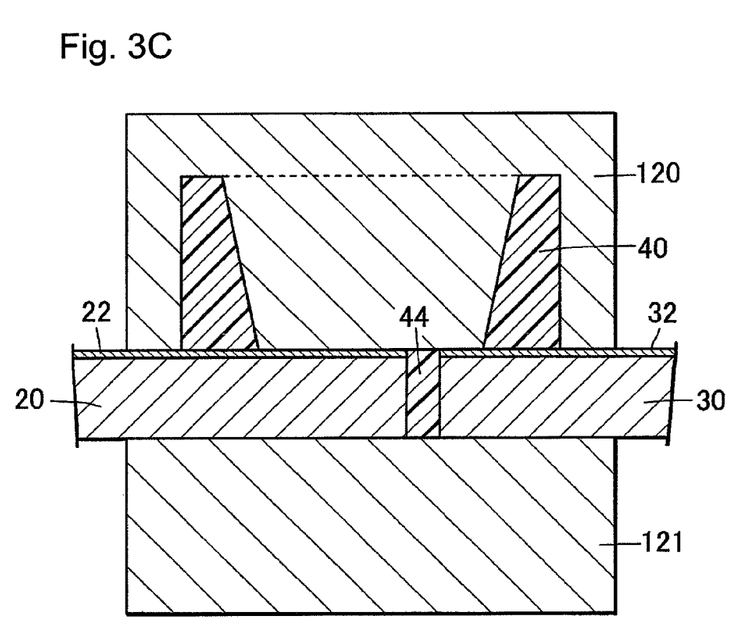
FIG. 3C is a schematic sectional view of a process of manufacturing the surface-mounted light emitting device according to the first embodiment.

As shown in FIG. 3C, the thermosetting resin is injected into the inner cavity 122 of the upper die 120, and the package is molded by heat curing. Injection of the thermosetting resin can be carried out by a transfer molding process.

In the transfer molding process, the thermosetting resin in the form of pellets having predetermined size is put into a predetermined container, which is subjected to a pressure. The thermosetting resin in molten state is sent from the container to a cavity between the upper die 120 and the lower die 121 that communicates with the container. Then the upper die 120 and the lower die 121 are heated to a predetermined temperature so as to cure the thermosetting resin that has been injected. The series of processes is called the transfer molding process.

Since the first lead electrode 20 and the second lead electrode 30 are sandwiched by the dies, the lead electrodes 20, 30 do not flutter when the thermosetting resin is injected, and therefore burrs can be suppressed from being generated.

4. Deburring Process

The package 40 that has been molded may have burrs formed on the periphery of the package 40 or in the recess 43. The burrs are removed before mounting the light emitting element 10. Burrs may be removed by combining deburring machines such as electrolysis, chemical dipping, dry blast, water jet, liquid honing, etc.

5. Formation of Eutectic Layer 70

Upon completion of heat curing, the package 40 is removed from the upper die 120 and the lower die 121, and the light emitting element 10 is mounted thereon. Before mounting the light emitting element 10, the eutectic layer 70 formed of a metallic soldering material is applied to the back surface of the light emitting element 10. The eutectic layer 70 may be formed by printing of a paste, dispensing, pattern transfer, preform, foil formation, metallization, ball formation or the like.

6. Mounting of Light Emitting Element 10

Figure 3D:
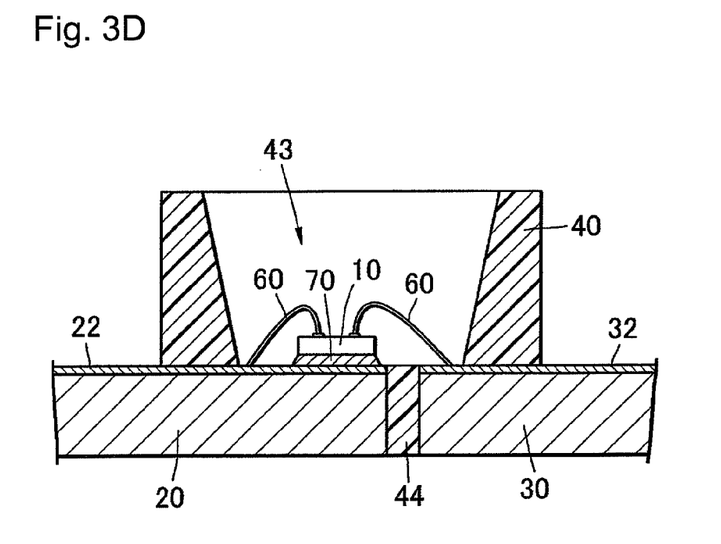
FIG. 3D is a schematic sectional view of a process of manufacturing the surface-mounted light emitting device according to the first embodiment.
Figure 3E:
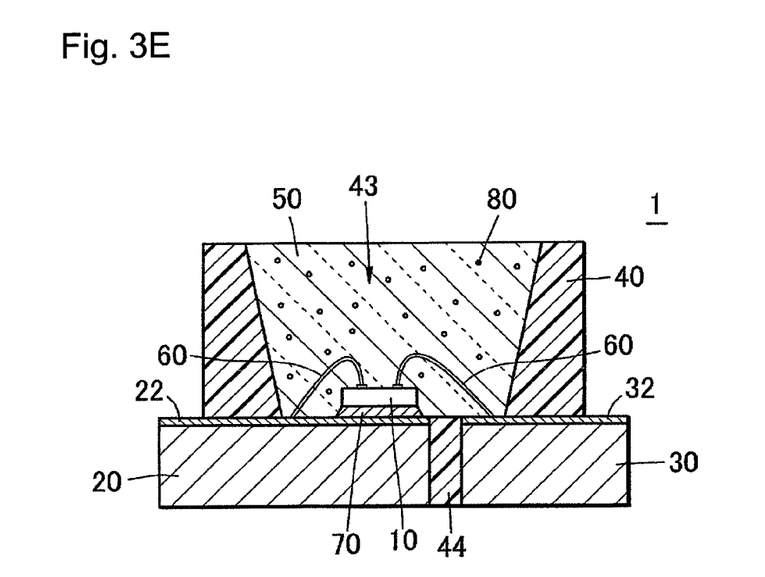
FIG. 3E is a schematic sectional view of a process of manufacturing the surface-mounted light emitting device according to the first embodiment.

The light emitting element 10 is placed in the recess 43 of the package 40 as shown in FIG. 3D. At this time, the light emitting element 10 must be disposed such that the eutectic layer 70 provided on the back surface of the light emitting element 10 makes contact with the upper surface of the first lead electrode 20. The light emitting element 10 can be fixed onto the upper surface of the first lead electrode 20 by heating the package 40 together with the light emitting element 10 so as to melt (reflow) the eutectic layer 70, and then leaving it to cool down.

Then the electrodes 11, 12 of the light emitting element 10 are electrically connected to the first lead electrode 20 and the second lead electrode 30 by means of the electrically conductive wires 60.

7. Application of Sealing Member 50

After mounting the light emitting element 10, the recess 43 is filled with the thermosetting resin to form the sealing member 50. The thermosetting resin may be applied by dripping, injection, extrusion or the like, while dripping is preferably employed. Dripping process enables it to effectively purge air from the recess 43 while filling the recess with the thermosetting resin. It is preferable to add the fluorescent material 80 to the thermosetting resin. Mixing the fluorescent material 80 makes it easier to control the color tone of light emitted by the light emitting device.

The thermosetting resin that has been applied is then heated so as to cure and form the sealing member 50.

EXAMPLE 1

EXAMPLES 1 to 10, COMPARATIVE EXAMPLES 1 to 6

1. Formulation of Raw Materials

According to formulations shown in Table 1 to Table 3, samples are prepared. Symbols in the tables denote the following materials.

(A) Epoxy Resin
(A1) Triazine-Induced Epoxy Resin
Tris(2,3-epoxypropyl)isocyanate (TEPIC-S: trade name manufactured by NISSAN CHEMICAL INDUSTRIES, LTD., epoxy equivalent: 100)
(A2) Hydrogenated Epoxy Resin
Bisphenol A type hydrogenated epoxy resin (YL-7170: trade name manufactured by Japan Epoxy Resins Co., Ltd., epoxy equivalent: 1,200)
(A3) Other Aromatic Epoxy Resin
Bisphenol A type epoxy resin (E1004: trade name manufactured by Japan Epoxy Resins Co., Ltd., epoxy equivalent: 890)
(B) Acid Anhydride
(B1) Carbon-carbon double bond-free acid anhydride: Methylhexahydrophthalic anhydride (RIKACID MH: trade name manufactured by New Japan Chemical Co., Ltd.)
(B2) Carbon-carbon double bond-containing acid anhydride: Tetrahydrophthalic anhydride (RIKACID TH: trade name manufactured by New Japan Chemical Co., Ltd.)
(C) Antioxidant
(C1) Phosphate-based antioxidant: Triphenyl phosphite
(trade name manufactured by Wako Pure Chemical Industries, Ltd.)
(C2) Phonol-based antioxidant: 2,6-di-t-butyl-p-cresol
(BHT: trade name manufactured by Wako Pure Chemical Industries, Ltd.)
(D) Titanium dioxide: Rutile type (TIPAQUE CR-90: trade name manufactured by ISHIHARA SANGYO KAISHA, LTD.)
(E) Inorganic filler: Crushed fused silica (trade name manufactured by TATSUMORI, LTD.)
(F) Curing catalyst
(F1) Phosphorus-based curing catalyst: Methyl-tributylphosphonium-dimethyl phosphate (PX-4 MP: trade name manufactured by Nippon Chemical Industrial Co., LTD.)
(F2) Imidazole-based curing catalyst: 2-ethyl-4-methylimidazole (2E4MZ: trade name manufactured by SHIKOKU CHEMICAL CORPORATION

TABLE 1

| | | | Example 1 | Example 2 | Example 3 | Example 4 | Example 5 |
|---|---|---|---|---|---|---|---|
| (A) | Epoxy | A1 (wt %) | 11 | 11 | 11 | 11 | 11 |
| | | A2 (wt %) | — | — | — | — | — |
| | | A3 (wt %) | — | — | — | — | — |
| (B) | Acid anhydride | B1 (wt %) | 19 | 19 | 19 | 19 | 19 |
| | | B2 (wt %) | — | — | — | — | — |
| (C) | Antioxidant | C1 (wt %) | 0.1 | 0.1 | 0.1 | 0.1 | 0.1 |
| | | C2 (wt %) | — | — | — | — | — |
| (D) | Light reflecting material (Titanium dioxide) | | 35 | 35 | 35 | 35 | 35 |
| (E) | Inorganic filler | | 35 | 35 | 35 | 35 | 35 |
| (F) | Curing catalyst | F1 (wt %) | — | — | — | — | — |
| | | F2 (wt %) | 0.1 | 0.1 | 0.1 | 0.1 | 0.1 |
| | Thickness of Ag plating | μm | 0.5 | 2 | 4 | 7 | 10 |
| (G) | Soldering material | G1 (m.p. 283° C.) | ○ | ○ | ○ | ○ | ○ |
| | | G2 (m.p. 285° C.) | — | — | — | — | — |
| | | G3 (m.p. 220° C.) | — | — | — | — | — |

TABLE 1-continued

|  |  |  | Example 1 | Example 2 | Example 3 | Example 4 | Example 5 |
|---|---|---|---|---|---|---|---|
|  |  | G4 (m.p. 183° C.) | — | — | — | — | — |
|  |  | G5 (m.p. 363° C.) | — | — | — | — | — |
| After soldering Molding | Color of package |  | white | white | white | white | white |
|  | Yellowing of package | — | white | white | white | white | white |
| Size of light emitting element (□600) | Flatness | μm | 10 | 10 | 10 | 10 | 10 |
|  | Relative flatness α | % | 1.7 | 1.7 | 1.7 | 1.7 | 1.7 |
| Evaluated by light emitting device | Discoloration of solder | — | no change | no change | no change | no change | no change |
|  | Yellowing of package |  | white | white | white | white | white |
|  | Shear strength | kgf | 2 | 3.8 | 3.4 | 3 | 2.5 | m.p.: Melting point

TABLE 2

|  |  |  | Example 6 | Example 7 | Example 8 | Example 9 | Example 10 |
|---|---|---|---|---|---|---|---|
| (A) | Epoxy | A1 (wt %) | 11 | 11 | 11 | 11 | 11 |
|  |  | A2 (wt %) | — | — | — | — | — |
|  |  | A3 (wt %) | — | — | — | — | — |
| (B) | Acid anhydride | B1 (wt %) | 19 | 19 | 19 | 19 | 19 |
|  |  | B2 (wt %) | — | — | — | — | — |
| (C) | Antioxidant | C1 (wt %) | 0.1 | 0.1 | 0.1 | 0.1 | 0.1 |
|  |  | C2 (wt %) | — | — | — | — | — |
| (D) | Light reflecting material (Titanium dioxide) |  | 35 | 35 | 35 | 35 | 35 |
| (E) | Inorganic filler |  | 35 | 35 | 35 | 35 | 35 |
| (F) | Curing catalyst | F1 (wt %) | — | — | — | — | — |
|  |  | F2 (wt %) | 0.1 | 0.1 | 0.1 | 0.1 | 0.1 |
|  | Thickness of Ag plating | μm | 2 | 2 | 4 | 4 | 4 |
| (G) | Soldering material | G1 (m.p. 283° C.) | — | — | ○ | ○ | ○ |
|  |  | G2 (m.p. 285° C.) | ○ | — | — | — | — |
|  |  | G3 (m.p. 220° C.) | — | ○ | — | — | — |
|  |  | G4 (m.p. 183° C.) | — | — | — | — | — |
|  |  | G5 (m.p. 363° C.) | — | — | — | — | — |
| After soldering Molding | Color of package |  | white | white | white | white | white |
|  | Yellowing of package | — | white | white | white | white | white |
| Size of light emitting element (□600) | Flatness | μm | 10 | 10 | 0.5 | 20 | 50 |
|  | Relative flatness α | % | 1.7 | 1.7 | 0.1 | 3.3 | 8.3 |
| Evaluated by light emitting device | Discoloration of solder | — | no change | no change | no change | no change | no change |
|  | Yellowing of package |  | white | white | white | white | white |
|  | Shear strength | kgf | 3.3 | 3.1 | 3.4 | 2.5 | 1.6 | m.p.: Melting point

TABLE 3

|  |  |  | Comparative Example 1 | Comparative Example 2 | Comparative Example 3 | Comparative Example 4 | Comparative Example 5 | Comparative Example 6 |
|---|---|---|---|---|---|---|---|---|
| (A) | Epoxy | A1 (wt %) | 11 | 11 | 11 | — | — | 11 |
|  |  | A2 (wt %) | — | — | — | 24 | — | — |
|  |  | A3 (wt %) | — | — | — | — | 24 | — |
| (B) | Acid anhydride | B1 (wt %) | 19 | 19 | 19 | — | 5 | 19 |
|  |  | B2 (wt %) | — | — | — | 5 | — | — |
| (C) | Antioxidant | C1 (wt %) | 0.1 | 0.1 | 0.1 | 0.1 | 0.1 | 0.1 |
|  |  | C2 (wt %) | — | — | — | 0.1 | 0.1 | — |
| (D) | Light reflecting material (Titanium dioxide) |  | 35 | 35 | 35 | 35 | 35 | 35 |
| (E) | Inorganic filler |  | 35 | 35 | 35 | 35 | 35 | 35 |
| (F) | Curing catalyst | F1 (wt %) | — | — | — | 0.1 | 0.1 | — |
|  |  | F2 (wt %) | 0.1 | 0.1 | 0.1 | — | — | 0.1 |

TABLE 3-continued

|  |  |  | Comparative Example 1 | Comparative Example 2 | Comparative Example 3 | Comparative Example 4 | Comparative Example 5 | Comparative Example 6 |
|---|---|---|---|---|---|---|---|---|
|  | Thickness of Ag plating | μm | 0 | 2 | 2 | 2 | 2 | 4 |
| (G) | Soldering material | G1 (m.p. 283° C.) | ○ | — | — | ○ | ○ | ○ |
|  |  | G2 (m.p. 285° C.) | — | — | — | — | — | — |
|  |  | G3 (m.p. 220° C.) | — | — | — | — | — | — |
|  |  | G4 (m.p. 183° C.) | — | ○ | — | — | — | — |
|  |  | G5 (m.p. 363° C.) | — | — | ○ | — | — | — |
| After soldering Molding | Color of package |  | white | white | Yellowing | white | white | white |
|  | Yellowing of package | — | white | white | — | Yellowing | Yellowing | white |
| Size of light emitting element (□600) | Flatness | μm | 10 | 10 | 10 | 10 | 10 | 55 |
|  | Relative flatness α | % | 1.7 | 1.7 | 1.7 | 1.7 | 1.7 | 9.2 |
| Evaluated by light emitting device | Discoloration of solder | — | no change | Discoloration | — | no change | no change | no change |
|  | Yellowing of package |  | Slight Yellowing | white | — | Yellowing | Yellowing | Yellowing |
|  | Shear strength | kgf | 0.4 | 3.4 | — | 3.5 | 3.6 | 0.4 | m.p.: Melting point

2. Preparation of Measuring Sample

First, (A) an epoxy resin, (B) an acid anhydride and (C) an antioxidant were preliminarily melt-mixed by a reaction kettle at 80° C. for 5 hours, solidified with cooling and then ground. The ground mixture was mixed with (D) a light reflecting agent, (E) an inorganic filler and (F) a curing catalyst in a predetermined mixing ratio, uniformly melt-kneaded using a hot twin roll, cooled and then ground to prepare a thermosetting resin for package 40.

The lead frame formed of copper alloy with an Ag film formed on the surface thereof is held between dies into which the thermosetting resin prepared as described above is injected by the transfer molding process, to form the package 40. A light emitting diode that emits blue light (made by forming a semiconductor layer having InGaN light emitting layer on a sapphire substrate) is used for the light emitting element 10, that is mounted on the first lead electrode 20 by using soldering materials of a plurality of kinds having different melting points.

Symbols assigned to the soldering materials shown in Tables 1 to 3 represent the following.

(G) Soldering Material

Soldering materials that can be used are Sn—Pb (melting point 285° C.), Au—Sn (melting point 282° C.), Sn—Ag—Cu (melting point 220° C.), Sn—Ag—Cu-x (x represents Bi, In, Ge or Ni, melting point 200 to 230° C.) and Sn—Zn.

(G1) Au—Sn (melting point 282° C.)
(G2) Sn—Pb (melting point 285° C.)
(G3) Sn—Ag—Cu (melting point 220° C.)
(G4) Sn—Pb (melting point 183° C.)
(G5) Au—Si (melting point 363° C.)

Electrical continuity between the light emitting element 10 and the lead electrodes 20, 30 was established by using gold wires 30 μm in diameter. Then the recess 43 of the package 40 is filled with the thermosetting resin by dripping to form the sealing member 50. The thermosetting resin contains 30 parts by weight of a YAG fluorescent material and 5 parts by weight of a light diffusing material formed of silicon oxide based on 100 parts by weight of a silicone resin. The thermosetting resin is heated from the room temperature for three hours to raise the temperature to 150° C., and is kept at 150° C. for five hours to cure. Last, cutting off the lead frame completes the light emitting device 1.

3. Evaluation of Light Emitting Device

Yellowing discoloration of the package 40 due to mounting of the light emitting element 10 was checked by visual observation. Yellowing was observed in Comparative Example 3 that employed a soldering material having melting point of 363° C. for the eutectic layer 70. This is because the high temperature required to melt the soldering material caused the cured thermosetting epoxy resin to deteriorate due to oxidation, thus resulting in yellowing discoloration.

4. Heating Experiment

Test pieces were made of the material used for the package 40, and were tested to check for discoloration when heated. The test pieces were molded into a disk measuring 50 mm in diameter and 3 mm with a pressure of 6.9 N/mm² at a temperature of 175° C. for 2 minutes. The test pieces were kept at 180° C. for 24 hours, before being observed to check for discoloration and, in the observation, it was found that test pieces of Comparative Examples 4 and 5 discolored to yellow. This experiment showed that the thermosetting epoxy resin containing no triazine-induced epoxy resin has low heat resistance and therefore undergoes yellowing discoloration even at a temperature of about 180° C.

5. Lighting Experiment

The light emitting devices 1 of Example and Comparative Examples were turned on to light for a long period of time, and were checked for discoloration of the eutectic layer 70 and yellowing of the package. The lighting experiment was conducted under condition of 85° C. in temperature and 85% in relative humidity for 1,000 hours. In the observation after the experiment, the eutectic layer 70 was observed under an optical microscope to check for discoloration after removing the light emitting element 10, and the package 40 was observed with the naked eye to check for yellowing.

Discoloration of the eutectic layer 70 was observed in Comparative Example 2 that employed a soldering material having melting point of 183° C. for the eutectic layer 70. It is considered that a soldering material having melting point of about 200° C. or lower is likely to be oxidized resulting in deterioration and yellowing.

Yellowing of the package 40 was observed in Comparative Examples 1, 4 and 5.

Since the Ag film of Comparative Example 1 is thin, there are possibilities of oxidation and colored deterioration due to poor crystallinity of Ag, and diffusion of Cu that is plated as the base material for the Ag film over the surface of the Ag film to turn into copper oxide thereby causing the Ag film to discolor on the surface thereof. When the Ag film discolors on the surface, the Ag film absorbs light emitted by the light emitting element and generates heat, thereby accelerating the temperature rise in the package. This process is supposed to have caused some discoloration of the package to yellow.

In Comparative Examples 4 and 5, since the thermosetting epoxy resin has low heat resistance, the resin is supposed to have been oxidized to deteriorate, thus resulting in discoloration of the package to yellow.

6. Measurement of Shear Strength

Bonding strength between the light emitting element 10 and the first lead electrode 20 was evaluated by measuring the shear strength with a shear tester. With a sample mounted on a stage of the sear tester and a shear tool set at a predetermined position, the shear tool is moved to pull off the light emitting element, and the force exerted by the shear tool when the light emitting element comes off (peak force) is the sear strength.

In the case of the light emitting element 10 measuring □600 μm used in Example, desired shear strength is from 1.0 kgf to 8.0 kgf. Comparative Example 1 that did not satisfy this requirement supposedly had plating film that was not smooth and the junction formed of the eutectic material including much bubbles that resulted in low bonding strength.

7. Measurement of Flatness

Flatness of a portion of the lead electrode 22 whereon the light emitting element 10 is to be mounted was measured by means of a laser measuring microscope. The height of the center of a measuring region from a datum plane that was determined by measuring the height of three corners of the measuring region was taken as the flatness.

By relating the discoloration of the package to the measurements of flatness and shear strength, it was found that the Ag film having larger value of flatness (that means rougher surface) showed lower shear strength. In Example 8 where the Ag film had a smaller value of flatness (that means smoother surface) showed no yellow discoloration of the package and higher shear strength. In Comparative Example 6 where flatness value was as high as 55 μm, the package showed yellow discoloration. This is supposedly because the poor flatness resulted in insufficient contact area between the light emitting element and the lead electrode, that led to low heat dissipation from the light emitting element and yellow discoloration. The sample of Comparative Example 6 also showed low shear strength.

Influence of the flatness is considered to vary depending on the chip size. That is, the same level of flatness (the same degree of roughness) would have greater influence on a smaller chip than on a large chip. Accordingly, relative flatness a given by normalizing the flatness by the chip size was determined for each sample of Examples and Comparative Examples. The relative flatness a (%)=Flatness (μm)/Size of light emitting element (μm)×100. The size of the light emitting element refers to the length of one side of the bottom surface of the light emitting element when the light emitting element has a square configuration, and the longer side when the light emitting element is rectangular.

The lowest value of relative flatness a was 0.1% of Example 8 that showed a high shear strength of 3.4 kgf and no yellow discoloration of the package. While Examples 1 to 7 (α=1.7), Examples 9 (α=3.3) and Examples 10 (α=8.3) showed no yellow discoloration of the package, Comparative Example 6 (α=9.2) showed yellow discoloration of the package. Comparative Example 6 having α=9.2 also exhibited low shear strength. From these results, it may be concluded that the relative flatness α is preferably about 9% or less.

The surface-mounted light emitting device of the present invention can be used in lighting apparatuses, displays, backlight light sources for cell phone, flashlights of camera, auxiliary light sources for moving picture, etc.

| [DESCRIPTION OF REFERENCE NUMERALS] | |
| --- | --- |
| 1 | Light emitting device |
| 10 | Light emitting element |
| 11 | First electrode of light emitting element |
| 12 | Second electrode of light emitting element |
| 20 | First lead electrode |
| 20a | Inner lead section of first lead electrode |
| 20b | Outer lead section of first lead electrode |
| 22 | Ag film |
| 30 | Second lead electrode |
| 30a | Inner lead section of second lead electrode |
| 30b | Outer lead section of second lead electrode |
| 32 | Ag film |
| 40 | Package |
| 41 | Bottom surface |
| 42 | Side face |
| 43 | Recess |
| 50 | Sealing member |
| 60 | Electrically conductive wire |
| 70 | Eutectic layer |
| 80 | Fluorescent material |
| 90 | Insulator film |
| 120 | Upper die |
| 121 | Lower die |

What is claimed is:

1. A light emitting device comprising:
   a light emitting element;
   a package comprising a portion formed of a thermosetting resin, said portion forming a thermosetting resin side wall of a recess such that said portion is located around said recess, wherein the light emitting element is mounted in the recess formed by the thermosetting resin side wall, and
   the lowest surface, inside the recess, of the thermosetting resin side wall is lower than the top surface of said light emitting element;
   a first lead electrode which is exposed at the bottom of the recess and whereon the light emitting element is mounted; and
   a second lead electrode which is exposed at the bottom of the recess and is electrically connected to the light emitting element;
   wherein the light emitting element is bonded to the first lead electrode through a eutectic layer, and
   at least a surface of the first lead electrode is coated with an Ag film, the Ag film being disposed
      between the first lead electrode and the light emitting element, and
      at an interface formed between one of said first and second lead electrodes, and a part of the side wall of the recess, such that the Ag film is sandwiched between the side wall of the recess, and said first or second lead electrode,
   a thickness of the Ag film being in the range from 0.5 μm to 20 μm.

2. The light emitting device according to claim 1, wherein the thickness of the Ag film is in the range from 1 μm to 15 μm.

3. A light emitting device comprising:
   a light emitting element;
   a package comprising a portion formed of a thermosetting resin, said portion forming a thermosetting resin side wall of a recess such that said portion is located around said recess, wherein the light emitting element is mounted in the recess formed by the thermosetting resin side wall, and the lowest surface, inside the recess, of the thermosetting resin side wall is lower than the top surface of said light emitting element;

a first lead electrode which is exposed at the bottom of the recess and whereon the light emitting element is mounted; and a second lead electrode which is exposed at the bottom of the recess and is electrically connected to the light emitting element;

wherein the light emitting element is bonded to the first lead electrode through a eutectic layer, at least a surface of the first lead electrode is coated with an Ag film, the Ag film being disposed between the first lead electrode and the light emitting element, and at an interface formed between one of said first and second lead electrodes, and a part of the side wall of the recess, such that the Ag film is sandwiched between the side wall of the recess, and said first or second lead electrode, and a part of the surface of the first lead electrode is a bonding region to be bonded with the light emitting element, the bonding region including a surface of the Ag film having a flatness in the range from 0.001 to 50 μm.

4. The light emitting device according to claim 1, wherein the eutectic layer is formed of a soldering material having a melting point in the range of 200° C. to 350° C.

5. The light emitting device according to claim 3, wherein the eutectic layer is formed of a soldering material having a melting point in the range of 200° C. to 350° C.

6. The light emitting device according to claim 1, wherein the package is formed of a cured thermosetting epoxy resin compound containing a triazine-induced epoxy resin.

7. The light emitting device according to claim 3, wherein the package is formed of a cured thermosetting epoxy resin compound containing a triazine-induced epoxy resin.

8. The light emitting device according to claim 1, wherein the package has a reflectivity of 70% or higher for light of 430 nm or longer, and the light emitting element emits a light having a peak emission wavelength in the range from 430 nm to 530 nm.

9. The light emitting device according to claim 3, wherein the package has a reflectivity of 70% or higher for light of 430 nm or longer, and the light emitting element emits a light having a peak emission wavelength in the range from 430 nm to 530 nm.

10. The light emitting device according to claim 1, further comprising a transparent sealing member for sealing the light emitting element, the sealing material being formed of a thermosetting resin.

11. The light emitting device according to claim 3, further comprising a transparent sealing member for sealing the light emitting element, the sealing material being formed of a thermosetting resin.

12. A method for manufacturing a light emitting device comprising:

a light emitting element;

a package comprising a portion formed of a thermosetting resin, said portion forming a side wall of a recess such that said portion is located around said recess, wherein the light emitting element is mounted in the recess;

a first lead electrode which is exposed at the bottom of the recess and whereon the light emitting element is mounted;

a second lead electrode which is exposed at the bottom of the recess and is electrically connected to the light emitting element;

an Ag film for coating at least a surface of the first lead electrode; and a eutectic layer positioned between the light emitting element and the first lead electrode;

the method comprising the steps of:

coating the surface of the first lead electrode with the Ag film;

after said coating step, sandwiching both the first and second lead electrodes between a upper die and a lower die, at least the upper die having an inner cavity corresponding to a shape of the package, and pressing the first and second lead electrodes which are sandwiched between the upper die and the lower die, against a protrusion provided with the upper die for forming the recess of the package;

after said sandwiching and pressing steps, injecting a thermosetting resin into the inner cavities of the upper die and the lower die and heat curing the thermosetting resin to form the package;

applying the eutectic layer formed of a metal soldering material to a back surface of the light emitting element;

after said injecting step and after the package has been formed:

mounting the light emitting element in the recess of the formed package so that the eutectic layer makes contact with an upper surface of the first lead electrode, and fixing the light emitting element on the first lead electrode by heating and melting the eutectic layer; and electrically connecting the light emitting element to the first and second lead electrodes.

13. The light emitting device according to claim 1, wherein the thermosetting resin portion which forms the side wall of the recess has a reflectivity of 70% or higher for light of 430 nm or longer, and the light emitting element emits a light having a peak emission wavelength in the range from 430 nm to 530 nm.

14. The light emitting device according to claim 3, wherein the thermosetting resin portion which forms the side wall of the recess has a reflectivity of 70% or higher for light of 430 nm or longer, and the light emitting element emits a light having a peak emission wavelength in the range from 430 nm to 530 nm.

15. The light emitting device according to claim 1, wherein in said light emitting device in which the thickness of the Ag film is in the range from 0.5 μm to 20 μm, the package is formed of a cured thermosetting epoxy resin compound containing a triazine-induced epoxy resin, and the light emitting element is bonded to the first lead electrode through said eutectic layer which is formed of a soldering material having a melting point in the range of 200° C. to 350° C.

16. The light emitting device according to claim 1, wherein in said light emitting device the thickness of the Ag film is in the range from 1 μm to 15 μm, the package is formed of a cured thermosetting epoxy resin compound containing a triazine-induced epoxy resin, and the light emitting element is bonded to the first lead electrode through said eutectic layer which is formed of a soldering material having a melting point in the range of 200° C. to 350° C.

17. The light emitting device according to claim 3, wherein in said light emitting device the thickness of the Ag film is in the range from 0.5 µm to 20 µm, the package is formed of a cured thermosetting epoxy resin compound containing a triazine-induced epoxy resin, and the light emitting element is bonded to the first lead electrode through said eutectic layer which is formed of a soldering material having a melting point in the range of 200° C. to 350° C.

18. The light emitting device according to claim 3, wherein in said light emitting device the thickness of the Ag film is in the range from 1 µm to 15 µm, the package is formed of a cured thermosetting epoxy resin compound containing a triazine-induced epoxy resin, and the light emitting element is bonded to the first lead electrode through said eutectic layer which is formed of a soldering material having a melting point in the range of 200° C. to 350° C.

19. The light emitting device according to claim 1, wherein in said light emitting device the package is formed of a cured thermosetting epoxy resin compound containing a triazine-induced epoxy resin, the thickness of said Ag film is in the range from 0.5 µm to 10 µm, and a part of the surface of the first lead electrode is a bonding region to be bonded with the light emitting element, said bonding region including a surface of the Ag film which has a flatness in the range from 0.5 to 50 µm.

20. The light emitting device according to claim 1, wherein the light emitting element is bonded to the first lead electrode through the eutectic layer which is formed of a soldering material having a melting point in the range of 200° C. to 350° C., the surface of the first lead electrode below the eutectic layer is coated with the Ag film such that the surface of the first lead electrode below the eutectic layer is a bonding region to be bonded with the light emitting element, said bonding region including a surface of the Ag film having a flatness in the range from 0.001 to 50 µm, and wherein a bonding strength between the light emitting element and the first lead electrode has a shear strength from 1.6 kgf to 3.8 kgf.

21. The light emitting device according to claim 3, wherein the light emitting element is bonded to the first lead electrode through the eutectic layer formed of a soldering material having a melting point in the range of 200° C. to 350° C., the surface of the first lead electrode below the eutectic layer is coated with the Ag film such that the surface of the first lead electrode below the eutectic layer is a bonding region to be bonded with the light emitting element, said bonding region including a surface of the Ag film having the flatness in the range from 0.001 to 50 µm, and wherein a bonding strength between the light emitting element and the first lead electrode has a shear strength from 1.6 kgf to 3.8 kgf.

22. The light emitting device according to claim 1, wherein a relative flatness a of said Ag film disposed between the first lead electrode and the light emitting element has a value in a range from 0.1 to 8.3%, wherein the relative flatness $\alpha(\%)=100\times$(flatness of the Ag film in µm)/(size of the light emitting element).

23. The light emitting device according to claim 3, wherein a relative flatness $\alpha$ of said Ag film disposed between the first lead electrode and the light emitting element has a value in a range from 0.1 to 8.3%, wherein the relative flatness $\alpha(\%)=100\times$(flatness of the Ag film in µm)/(size of the light emitting element).

24. The light emitting device according to claim 1, wherein a surface of said Ag film has a flatness in the range from 0.001 to 50 µm.

25. The light emitting device according to claim 1, wherein said first lead electrode has a side surface which is at a side of the light emitting device, and silver is not disposed on the side surface of the first lead electrode.

26. The light emitting device according to claim 3, wherein said first lead electrode has a side surface which is at a side of the light emitting device, and silver is not disposed on the side surface of the first lead electrode.

27. The light emitting device according to claim 1, wherein the thickness of the Ag film is in the range from 0.5 µm to 10 µm, and a part of the surface of the first lead electrode is a bonding region to be bonded with the light emitting element, said bonding region including a surface of the Ag film which has a flatness in the range from 0.5 to 20 µm.

28. The light emitting device according to claim 3, wherein a thickness of the Ag film is in the range from 0.5 µm to 10 µm, and the surface of the first lead electrode below the eutectic layer is coated with the Ag film such that the surface of the first lead electrode below the eutectic layer is a bonding region to be bonded with the light emitting element, said bonding region including a surface of the Ag film having the flatness in the range from 0.5 to 20 µm.

* * * * *